(12) United States Patent
Clark et al.

(10) Patent No.: US 9,978,649 B2
(45) Date of Patent: May 22, 2018

(54) SOLID SOURCE DOPING FOR SOURCE AND DRAIN EXTENSION DOPING

(71) Applicant: Tokyo Electron Limited, Minato-ku, Tokyo (JP)

(72) Inventors: Robert D. Clark, Livermore, CA (US); Steven P. Consiglio, Albany, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/465,311

(22) Filed: Mar. 21, 2017

(65) Prior Publication Data
US 2017/0271212 A1    Sep. 21, 2017

Related U.S. Application Data

(60) Provisional application No. 62/311,199, filed on Mar. 21, 2016.

(51) Int. Cl.
| | |
|---|---|
| *H01L 21/8238* | (2006.01) |
| *H01L 29/78* | (2006.01) |
| *H01L 29/66* | (2006.01) |
| *H01L 21/225* | (2006.01) |
| *H01L 21/324* | (2006.01) |
| *H01L 21/033* | (2006.01) |
| *H01L 27/092* | (2006.01) |

(Continued)

(52) U.S. Cl.
CPC .. *H01L 21/823814* (2013.01); *H01L 21/0332* (2013.01); *H01L 21/2254* (2013.01); *H01L 21/324* (2013.01); *H01L 21/823821* (2013.01); *H01L 27/0922* (2013.01); *H01L 29/161* (2013.01); *H01L 29/167* (2013.01); *H01L 29/66545* (2013.01); *H01L 29/66795* (2013.01); *H01L 29/785* (2013.01); *H01L 2029/7858* (2013.01)

(58) Field of Classification Search
CPC .......... H01L 21/823814; H01L 29/785; H01L 29/66795; H01L 29/66545; H01L 21/2254; H01L 21/324; H01L 21/0332; H01L 21/823821; H01L 27/0922; H01L 29/161; H01L 29/167; H01L 2029/7858
See application file for complete search history.

(56) References Cited

U.S. PATENT DOCUMENTS

9,362,179 B1 * 6/2016 Cheng ............. H01L 21/823821
2012/0138886 A1 6/2012 Kuhn et al.
(Continued)

*Primary Examiner* — Roy Potter (57) ABSTRACT

A method is provided for solid source doping for source and drain extensions. According to one embodiment, the method includes providing a substrate containing fins of first and second film stacks, sacrificial gates across and on the fins of the first and second film stacks, where the first and second film stacks include alternating first and second films, and where the first films extend through sidewall spacers on the sacrificial gates, selectively forming a first mask layer on the sidewall spacers and on the first films of the first film stack, depositing a first dopant layer on the substrate, heat-treating the substrate to diffuse dopants from the first dopant layer into the first films of the second film stack to form doped first films in the second film stack, and removing the first mask layer from the substrate. The processing steps may be repeated for the second film stack.

20 Claims, 7 Drawing Sheets

(51) Int. Cl.
*H01L 29/161* (2006.01)
*H01L 29/167* (2006.01)

(56) References Cited

U.S. PATENT DOCUMENTS

2017/0025533 A1* 1/2017 Phoa ............... H01L 21/823412
2017/0104061 A1* 4/2017 Peng ................... H01L 29/0649

* cited by examiner

SOLID SOURCE DOPING FOR SOURCE AND DRAIN EXTENSION DOPING

CROSS-REFERENCE TO RELATED APPLICATIONS

This application is related to and claims priority to U.S. Provisional Patent Application Ser. No. 62/311,199 filed on Mar. 21, 2016, the entire contents of which are herein incorporated by reference.

FIELD OF INVENTION

The present invention relates to the field of semiconductor manufacturing and semiconductor devices, and more particularly solid source doping for source and drain extension doping in fin field-effect transistors (finFETs) and lateral gate all around metal-oxide-semiconductor field-effect transistors (MOSFETs).

BACKGROUND OF THE INVENTION

The semiconductor industry has relied on scaling/reducing device feature size in order to boost performance and increase transistor density. The continued device performance improvement due to scaling has seen the introduction of unique technologies such as semiconductor on insulator (e.g., silicon on insulator (SOI) and germanium on insulator (GeOI), stressor such SiGe, SiC to improve mobility at the 90 nm node, epitaxial regrowth of source and drain (raised source and drain), high-k metal gate (HKMG) at the 45 nm node, and 3D structures such as FinFETs and trigates at the 22 nm node.

However, maintaining the device performance and good short channel control is quite challenging beyond the 14 nm technology node. New materials (e.g., III-V semiconductors, Ge, SiGe, graphene, $MoS_2$, $WS_2$, $MoSe_2$, and $WS_2$) and new integration schemes (e.g., nanowires) are needed. Nanowire transistors offer scaling of feature sizes, good short channel control, and enhancement in the device mobility, hence enhancement in device speed.

SUMMARY OF THE INVENTION

Embodiments of the invention provide methods for using a solid source doping for source and drain extension doping in finFETs and lateral gate all around MOSFETs. The solid source doping forms doped extensions from the source and drain regions through a sidewall spacer. The doped extensions allow for increased drive current through the device and thus faster and lower delay operation of the device.

According to one embodiment, a method is provided for solid source doping for source and drain extension doping in lateral gate all around MOSFETs. The method includes providing a substrate containing fins of first and second film stacks, sacrificial gates across and on the fins of the first and second film stacks, where the first and second film stacks include alternating first and second films, and where the first films extend through sidewall spacers on the sacrificial gates, selectively forming a first mask layer on the sidewall spacers and on the first films of the first film stack, depositing a first dopant layer on the substrate, heat-treating the substrate to diffuse dopants from the first dopant layer into the first films of the second film stack to form doped first films in the second film stack, and removing the first mask layer from the substrate. The method further includes selectively forming a second mask layer on the sidewall spacers and the doped first films in the second film stack, depositing a second dopant layer on the substrate, heat-treating the substrate to diffuse dopants from the second dopant layer into the first films of the first film stack to form a doped first films in the first film stack, and removing the second mask layer from the substrate. The method can further include epitaxially growing source and drain structures on the source and drain regions of the doped first and second film stacks.

According to one embodiment, a method is provided for solid source doping for source and drain extension doping in finFETs. The method includes providing a substrate containing fins of first and second features, sacrificial gates across and on the fins of the first and second features, where the fins of the first and second features extend through sidewall spacers on the sacrificial gates, selectively forming a first mask layer on the sidewall spacers and on the fin of the first features, depositing a first dopant layer on the substrate, heat-treating the substrate to diffuse dopants from the first dopant layer into the fin of the second feature to form a doped fin of the second feature, and removing the first mask layer from the substrate. The method further includes selectively forming a second mask layer on the sidewall spacers and on the doped fin of the second feature, depositing a second dopant layer on the substrate, heat-treating the substrate to diffuse dopants from the second dopant layer into the fin of the first feature to form a doped fin of the first feature, and removing the second mask layer from the substrate. The method can further include epitaxially growing source and drain structures on the source and drain regions of the doped fins of the first and second features.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1A:
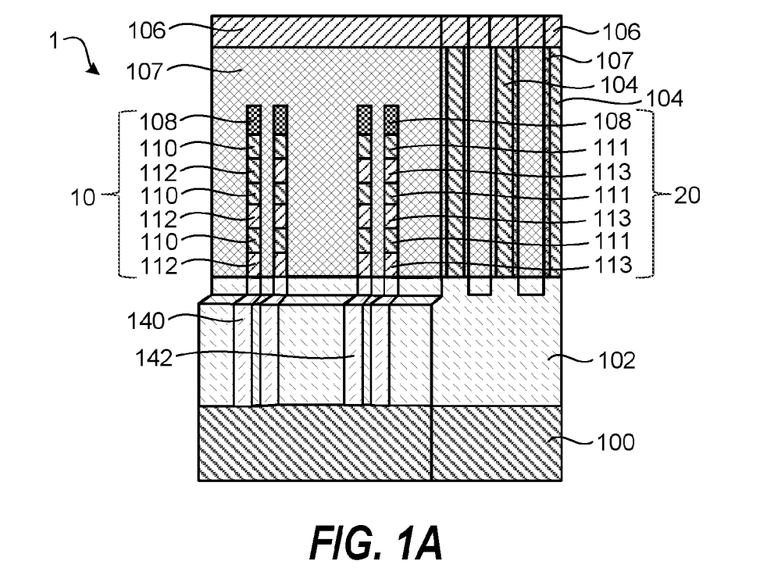
FIGS. 1A-1L schematically show through cross-sectional views a method of forming a semiconductor device according to an embodiment of the invention.

FIGS. 1A-1L schematically show through cross-sectional views a method of forming a semiconductor device according to an embodiment of the invention. FIG. 1A shows a substrate 1 containing a partially manufactured device that may be formed using conventional semiconductor manufacturing methods. The substrate 1 includes a base layer 100 (e.g., Si), a dielectric layer 102 (e.g., $SiO_2$), raised features 140 and 142, a first fin containing a first film stack 10 containing alternating films 110 and 112 and an optional mask layer 108, and a second fin containing a second film stack 20 containing alternating films 111 and 113 and the optional mask layer 108. According to the embodiment shown in FIGS. 1A-1J, the substrate 1 contains two adjacent first film stacks 10 and two adjacent second film stacks 20. However, according to other embodiments, the substrate 1 may contain any number of first film stacks 10 and second film stacks 20. The first film stacks 10 and the second film stacks 20 may contain the same material layers or alternatively they may contain different material layers. The substrate 1 further includes sacrificial gates 104 (e.g., poly Si on SiO$_2$) formed across and on the fins of the first and second film stacks 10 and 20, sidewall spacers 107 on the sacrificial gates 104, and a hardmask layer 106 on the sacrificial gates 104. The alternating films 110, 111, 112, and 113 extend through the sacrificial gates 104 and the sidewall spacers 107 to expose source and drain regions of the device. In one example, the alternating films 110 and 112 may be selected from Si and SiGe, respectively, and the alternating films 111 and 113 may be selected from SiGe and Ge, lower Ge % SiGe and higher Ge % SiGe, and Ge and SiGe, respectively. Those skilled in the art will readily realize that the films 112 and 113 may be selected from any materials having a sufficient etch selectivity relative to films 110 and 111, and which can be deposited epitaxially without forming film defects. The raised features 140 and 142 may contain different materials if the first and second films stacks 10 and 20 contain different materials. The sidewall spacers 107 may include SiN, SiO$_2$, SiON, SiOCN or SiBCN, for example.

Figure 1B:
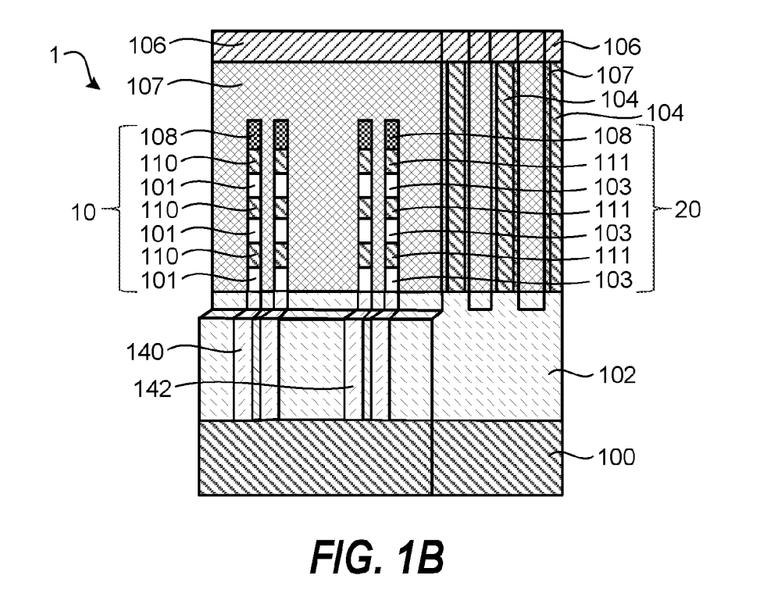

The method further includes, performing an isotropic etching process that recesses the films 112 and 113 into the sidewall spacers 114. In one example, the films 112 and 113 maybe recessed approximately 5 nm inside the sidewall spacers 114. For example, SiGe films 112 and 113 may be selectively recessed relative to Si films 110 and 111 using well-known selective etching methods. If the films 112 and 113 contain different materials, it may be necessary to mask the films 112 while etching the films 113, and vice versa. FIG. 1B schematically shows opening 101 and 103 that are formed where the films 112 and 113 have been recessed.

Figure 1C:
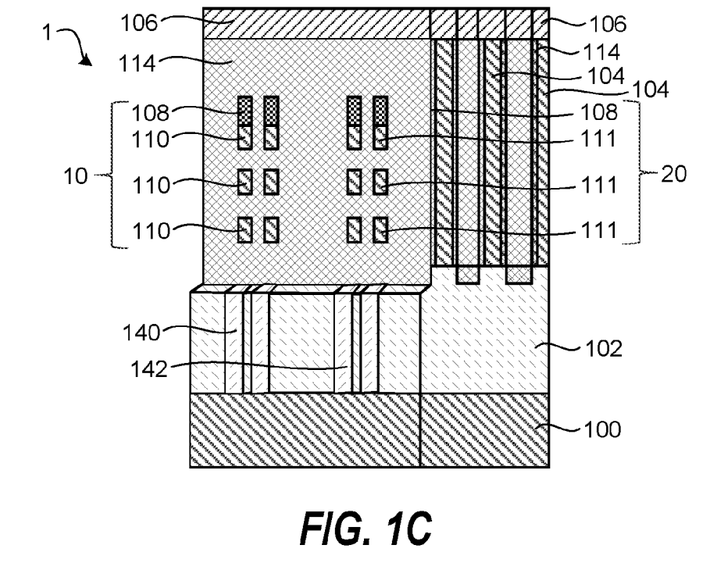

The method further includes depositing a spacer layer on the substrate 1 that fills the opening 101 and 103, and thereafter, performing anisotropic etching to form sidewall spacers 114 that cover the recessed films 112 and 113. The resulting substrate 1 is shown in FIG. 1C.

Figure 1D:
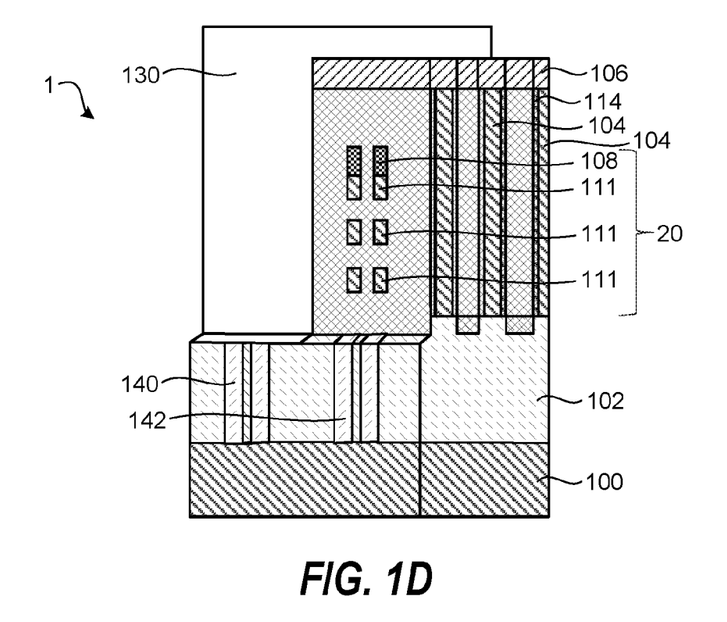

The method further includes, as depicted in FIG. 1D, selectively forming a first mask layer 130 on the sidewall spacers 114 and on the first film stack 10 but not on the second film stack 20. The first mask layer 130 may be formed by conventional deposition, lithography, and etching processes. In some examples, the first mask layer 130 can include SiO$_2$, amorphous carbon, SiC, or amorphous Si.

Figure 1E:
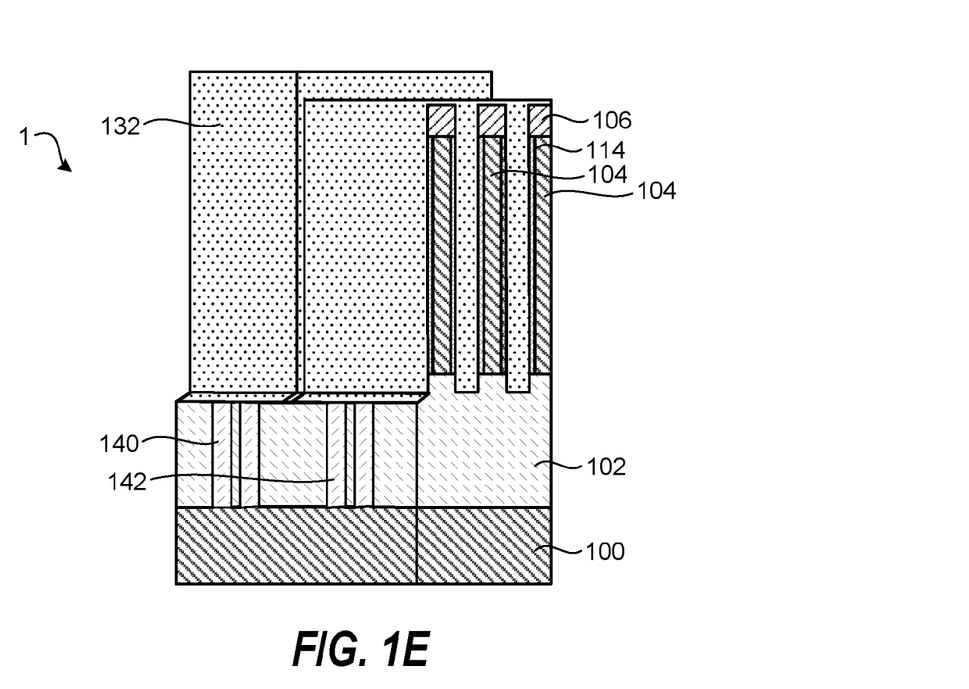

The method further includes, as depicted in FIG. 1E, depositing a first dopant layer 132 on the substrate 1. The first dopant layer 132 dopant may be deposited on the substrate 1 by atomic layer deposition (ALD). The first dopant layer 132 can include an oxide layer (e.g., SiO$_2$), a nitride layer (e.g., SiN), or an oxynitride layer (e.g., SiON), or a combination of two or more thereof. The first dopant layer 132 can include one or more p-type or n-type dopants from the Periodic Table of the Elements, including from Group IIIA : boron (B), aluminum (Al), gallium (Ga), indium (In), and thallium (Tl); and Group VA: nitrogen (N), phosphorous (P), arsenic (As), antimony (Sb), and bismuth (Bi). According to some embodiments, the first dopant layer 132 can contain low dopant levels, for example between about 0.5 and about 5 atomic % dopant. According to other embodiments, the first dopant layer 132 can contain medium dopant levels, for example between about 5 and about 20 atomic % dopant. According to yet other embodiments, the first dopant layer 132 can contain high dopant levels, for example greater than 20 atomic % dopant. In some examples, a thickness of the first dopant layer 132 can be 4 nanometers (nm) or less, for example between 1 nm and 4 nm, between 2 nm and 4 nm, or between 3 nm and 4 nm. However, other thicknesses may be used.

According to other embodiments, the first dopant layer 132 can contain or consist of a doped high-k dielectric material in the form of an oxide layer, a nitride layer, or an oxynitride layer. The dopants in the high-k dielectric material may be selected from the list of dopants above. The high-k dielectric material can contain one or more metal elements selected from alkaline earth elements, rare earth elements, Group IIIA, Group IVA, and Group IVB elements of the Periodic Table of the Elements. Alkaline earth metal elements include beryllium (Be), magnesium (Mg), calcium (Ca), strontium (Sr), and barium (Ba). Exemplary oxides include magnesium oxide, calcium oxide, and barium oxide, and combinations thereof. Rare earth metal elements may be selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). The Group IVB elements include titanium (Ti), hafnium (Hf), and zirconium (Zr). According to some embodiments of the invention, the high-k dielectric material may contain HfO$_2$, HfON, HfSiON, ZrO$_2$, ZrON, ZrSiON, TiO$_2$, TiON, Al$_2$O$_3$, La$_2$O$_3$, W$_2$O$_3$, CeO$_2$, Y$_2$O$_3$, or Ta$_2$O$_5$, or a combination of two or more thereof. However, other dielectric materials are contemplated and may be used. Precursor gases that may be used in ALD of high-k dielectric materials are described in U.S. Pat. No. 7,772,073, the entire contents of which are hereby incorporated by reference.

The method further includes, heat-treating the substrate 1 to diffuse dopants (e.g., B, Al, Ga, In, Tl, N, P, As, Sb, or Bi) from the first dopant layer 132 into the second film stack 20. The heat-treating can include heating the substrate 1 in an inert atmosphere (e.g., argon (Ar) or nitrogen (N$_2$)), under vacuum, or in an oxidizing atmosphere (e.g., oxygen (O$_2$) or water (H$_2$O)) to a temperature between 100° C. and 1500° C. for between 10 nanoseconds and 10 minutes. Some heat-treating examples include substrate temperatures between 100° C. and 500° C., between 200° C. and 500° C., between 300° C. and 500° C., and between 400° C. and 500° C. Other examples include substrate temperatures between 500° C. and 1000° C., between 600° C. and 1000° C., between 700° C. and 1000° C., between 800° C. and 1000° C., and between 900° C. and 1000° C. In some examples, the heat-treating may include rapid thermal annealing (RTA), a spike anneal, or a laser spike anneal.

According to one embodiment, the first dopant layer 132 contains n-type dopants (e.g., P, As, Sb) that diffuse from the first dopant layer 132 into the first films 111 to form a NFET region.

Figure 1F:
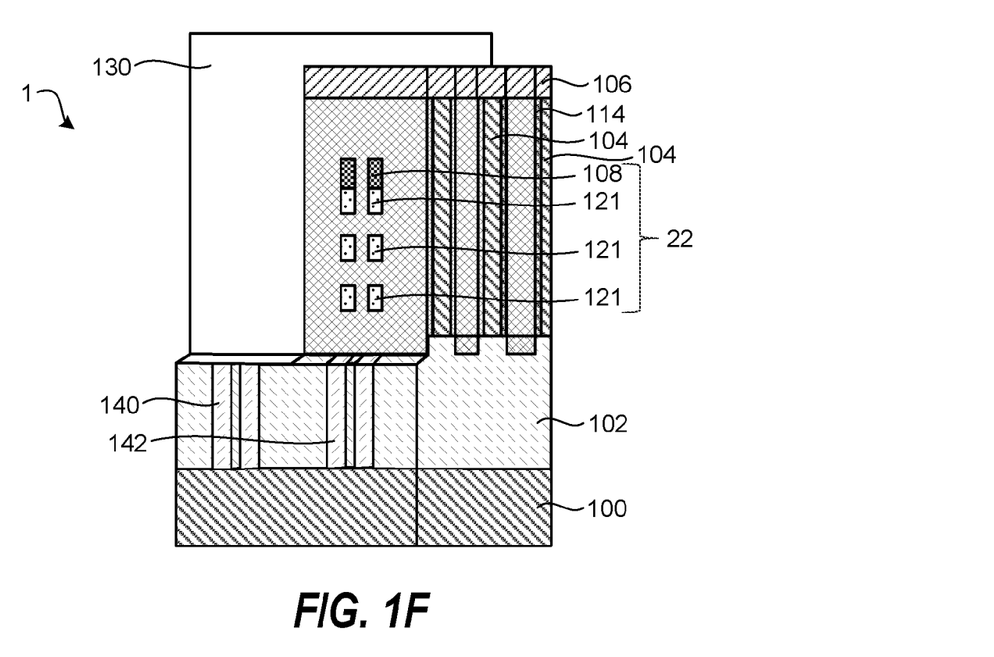

Thereafter, the remainder of the first dopant layer 132 may be removed using a dry etching process or a wet etching process to reveal the doped first films 121 of the second film stack 22. This is depicted in FIG. 1F. Additionally, a dry or wet cleaning process may be performed to remove any etch residues from the substrate 1 following the heat-treating.

Figure 1G:
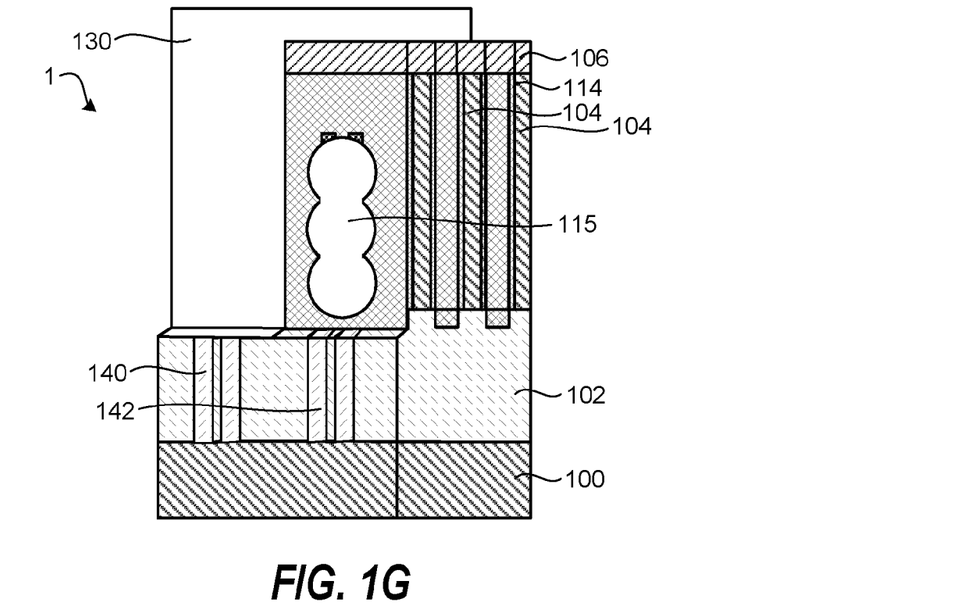

According to one embodiment, as depicted in FIG. 1G, the method further includes selectively and epitaxially growing source and drain structures 115 in the source and drain regions of the doped first films 121 of the second film stack 22. In one example, for a NFET region, the source and drain structures 115 can include SiC.

Figure 1H:
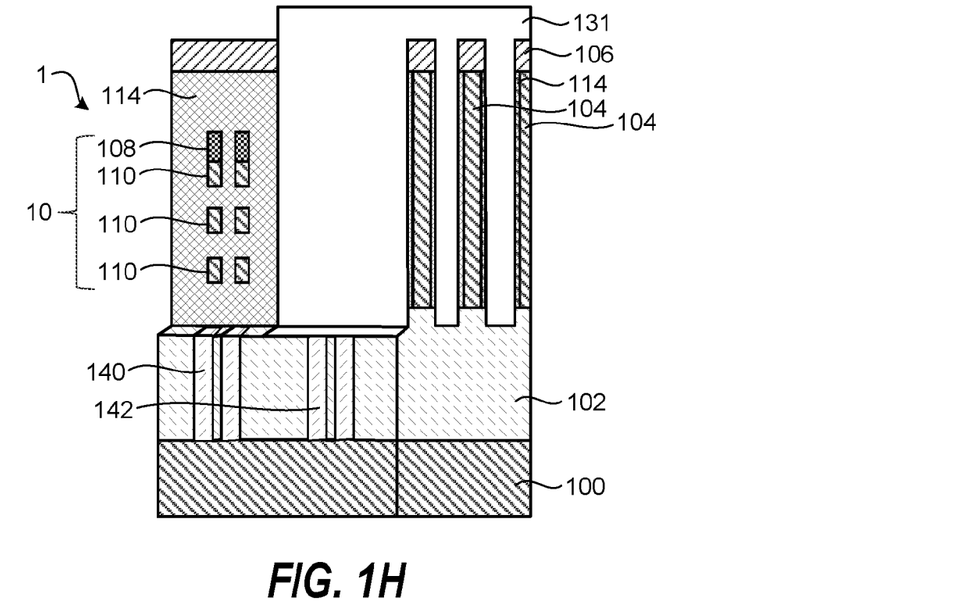
Figure 1I:
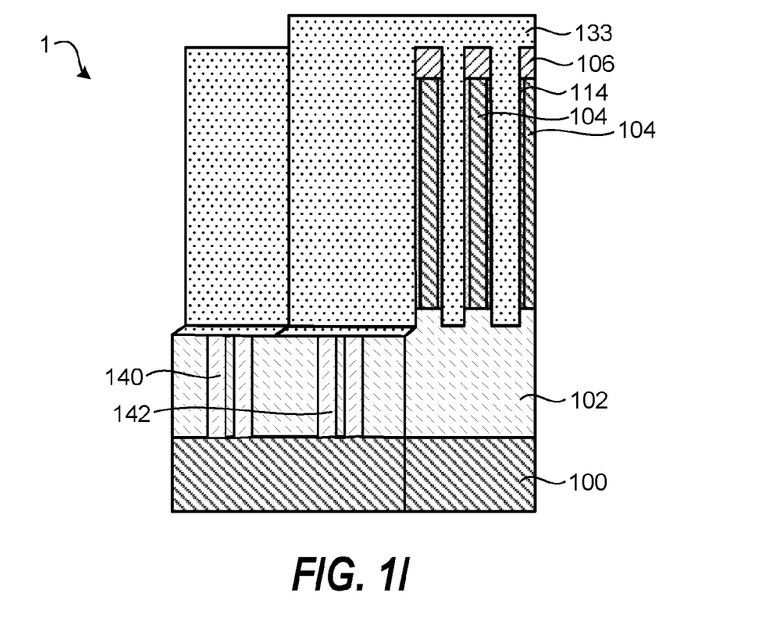

The method further includes, as shown in FIG. 1H, removing the first mask layer 130 from the substrate 1 and selectively forming a second mask layer 131 on the second film stack 22 but not on the first film stack 10. The second mask layer 131 may be formed by conventional deposition, lithography, and etching processes. In some examples, the second mask layer 131 can include SiO$_2$, amorphous carbon, SiC, or amorphous Si. The method further includes, as depicted in FIG. 1I, depositing a second dopant layer 133 on the substrate 1. The second dopant layer 133 contains different dopants than the first dopant layer 132 but may be selected from the same list of materials as the first dopant layer 132 above.

Figure 1J:
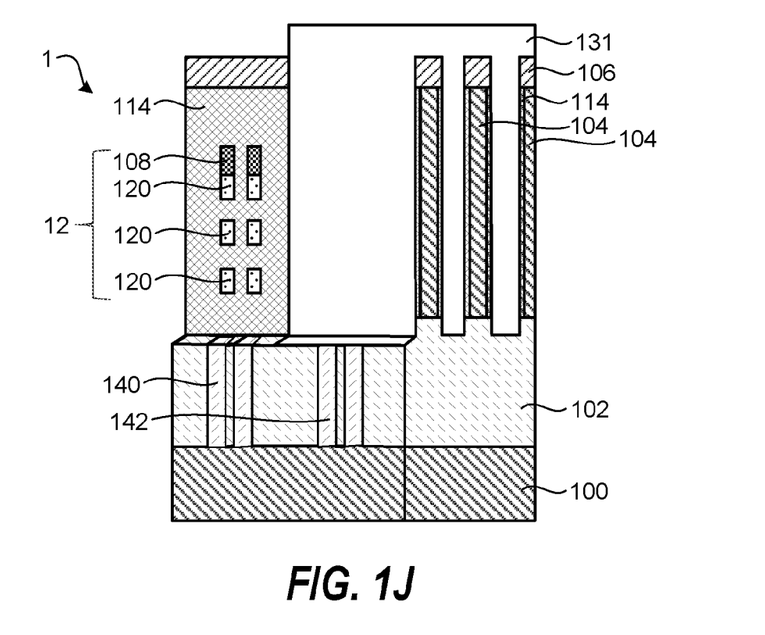

The method further includes, heat-treating the substrate 1 to diffuse dopants from the second dopant layer 133 into the first film stack 10 in the source and drain regions. Examples of heat-treating conditions were described above. Thereafter, the remainder of the second dopant layer 133 may be removed using a dry etching process or a wet etching process to reveal the doped first films 120 of the first film stack 12. This is depicted in FIG. 1J.

According to one embodiment, the second dopant layer 133 contains p-type dopants (e.g., B, Al, Ga) that diffuse from the second dopant layer 133 into the first films 110 to form a PFET region.

Figure 1K:
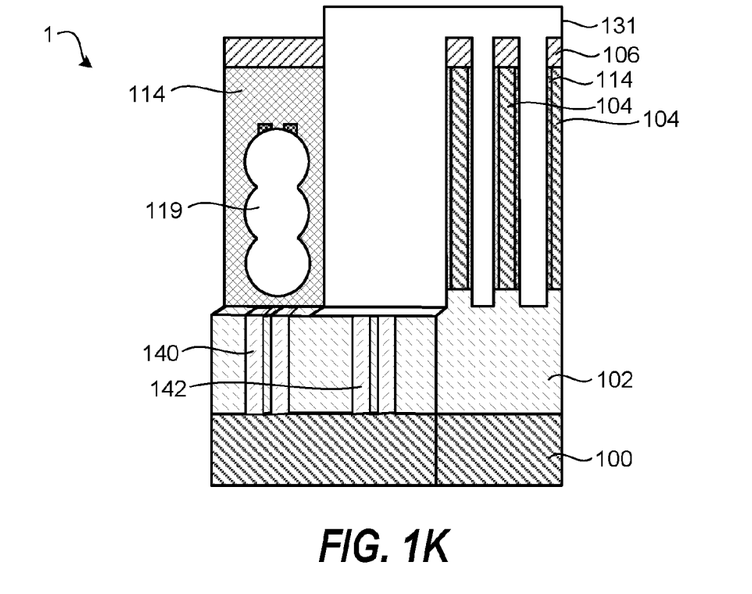

According to one embodiment, as depicted in FIG. 1K, the method further includes selectively and epitaxially growing source and drain structures 119 on the source and drain regions of the doped first films of the first film stack 12. In one example, for a PFET region, the source and drain structures 119 can include SiGe. Thereafter, the method includes removing the second mask layer 131 from the substrate 1. The resulting structure is depicted in FIG. 1L.

Figure 1L:
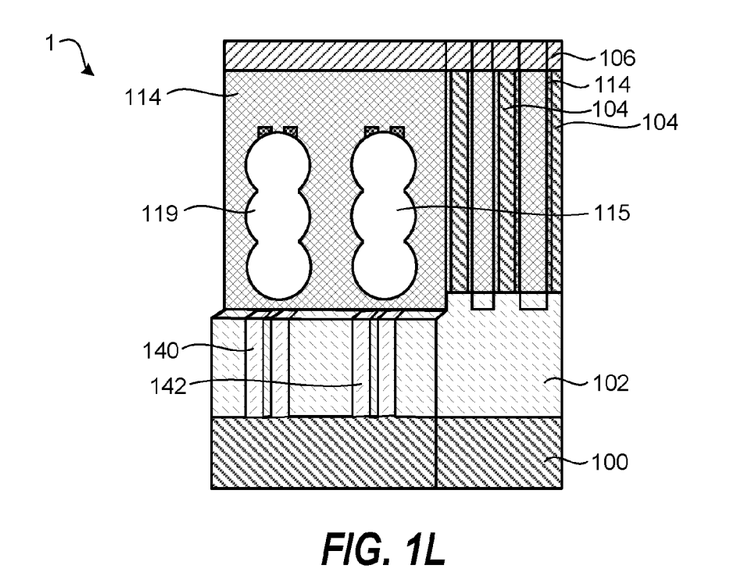

The substrate 1 containing the device in FIG. 1L includes doped extensions from the source and drain regions through the sidewall spacers 114. The doped extensions in the NFET and PFET regions allow for increased drive current through device due to lower total device resistance and thus faster and lower delay operation of the device. The doped extensions containing the doped first films 120 and 121 only extend a few nanometers into sidewall spacers 114 and the remainder of the first films 110 and 111 are undoped.

Referring back to FIGS. 1F and 1G, according to another embodiment of the invention, the step of epitaxially growing source and drain structures 115 on the source and drain regions of the doped first films 121 of the second film stack 22 may be delayed. Instead, the method may proceed as described in FIGS. 1H-1K, followed by removing the second mask layer 131 from the substrate 1, forming an additional mask layer on the first film stack 12, epitaxially growing source and drain structures 115 on the source and drain regions of the second film stack 22, and removing the additional mask layer from the substrate. The resulting structure is the same as shown in FIG. 1L.

Further processing of the substrate 1 in FIG. 1L can include removing the metal-containing hardmask layer 106, removing the sacrificial gates 104 in an etching process, removing the films 112 and 113 (e.g., SiGe) in a selective etching process to release the undoped first films 110 and 111 between the sidewall spacers 114 and the doped first films 120 and 121 (e.g., Si) as nanowires, depositing a dielectric film on the nanowires, and depositing a gate electrode layer on the dielectric film.

Figure 2A:
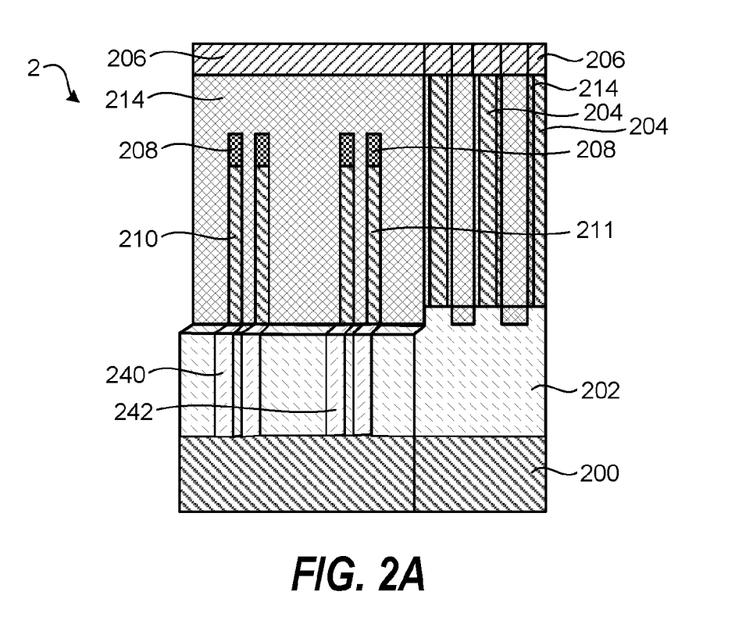
FIGS. 2A-2B schematically show through cross-sectional views a method of forming a semiconductor device according to an embodiment of the invention.
Figure 2B:
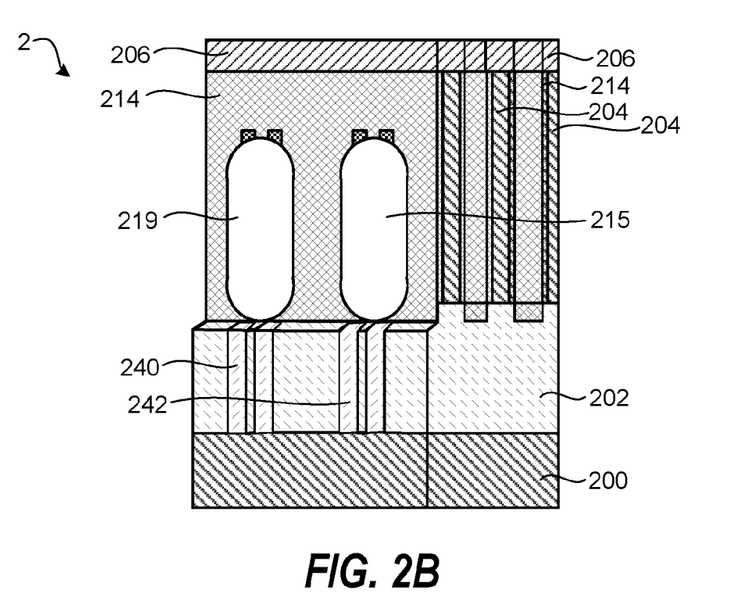

FIGS. 2A-2B schematically show through cross-sectional views a method of forming a semiconductor device according to an embodiment of the invention. The method is similar to the method described above for FIGS. 1D-1L, and will not be repeated in detail for brevity. The method includes, in FIG. 2A, providing a substrate 2 containing fins of first and second features 210 and 211, sacrificial gates 204 across and on the fins of the first and second features 210 and 211, where the first and second features 210 and 211 extend through sidewall spacers 214 on the sacrificial gates 204 in source and drain regions. The substrate 2 further includes raised features 240 and 242. Thereafter, the process flow includes selectively forming a first mask layer on the sidewall spacers 214 and on the fin of the first features 210, depositing a first dopant layer on the substrate 2, heat-treating the substrate 2 to diffuse dopants from the first dopant layer into the fin of the second feature 211 to form a doped fin of the second feature, and removing the first mask layer from the substrate 2. The method further includes selectively forming a second mask layer on the sidewall spacers 214 and on the doped fin of the second feature in source and drain regions, depositing a second dopant layer on the substrate, heat-treating the substrate 2 to diffuse dopants from the second dopant layer into the fin of the first feature 210 to form a doped fin of the first feature, and removing the second mask layer from the substrate 2. The method can further include selectively and epitaxially growing source and drain structures 219 and 215 on the source and drain regions of the doped fins of the first and second features.

According to one embodiment, the source and drain structures contain Ge or SiGe in a PFET region and SiC in a NFET region. In one example, the fin of the first feature includes SiGe and the fin of the second feature includes Si. Furthermore, the first dopant layer can include an n-type dopant and the second dopant layer can include a p-type dopant.

A plurality of embodiments for using solid source doping for source and drain extension doping in finFETs and lateral gate all around MOSFETs have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:
1. A substrate processing method, comprising:
providing a substrate containing fins of first and second film stacks, sacrificial gates across and on the fins of the first and second film stacks, wherein the first and second film stacks include alternating first and second films, and wherein the first films extend through sidewall spacers on the sacrificial gates;
selectively forming a first mask layer on the sidewall spacers and on the first films of the first film stack films stack;
depositing a first dopant layer on the substrate;
heat-treating the substrate to diffuse dopants from the first dopant layer into the first films of the second film stack to form doped first films in the second film stack;
removing the first mask layer from the substrate;
selectively forming a second mask layer on the sidewall spacers and the doped first films in the second film stack;
depositing a second dopant layer on the substrate;
heat-treating the substrate to diffuse dopants from the second dopant layer into the first films of the first film stack to form a doped first films in the first film stack; and
removing the second mask layer from the substrate.

2. The method of claim 1, further comprising
removing the sacrificial gates and the second films to form nanowires of the first films and doped first films.

3. The method of claim 2, further comprising
depositing a dielectric film on the nanowires between the sidewall spacers; and
depositing a gate electrode layer on the dielectric film.

4. The method of claim 1, further comprising
epitaxially growing source and drain structures on the doped first films in the first and second film stacks in source and drain regions.

5. The method of claim 4, wherein the source and drain structures contain Ge or SiGe in a PFET region and SiC in a NFET region.

6. The method of claim 1, wherein the alternating first and second films in the first and second film stacks include alternating films of Si and SiGe.

7. The method of claim 1, wherein the alternating first and second films in the first film stack are selected from alternating films of SiGe and Ge, lower Ge % SiGe and higher Ge % SiGe, and Ge and SiGe.

8. The method of claim 7, wherein the alternating first and second films in the second film stack include alternating films of Si and SiGe.

9. The method of claim 1, wherein the first dopant layer includes an n-type dopant and the second dopant layer includes a p-type dopant.

10. The method of claim 1, wherein the doped first films in the first and second film stacks form a NFET region and a PFET region.

11. The method of claim 1, further comprising removing the first and second dopant layers from the substrate.

12. A substrate processing method, comprising:
providing a substrate containing fins of first and second features, sacrificial gates across and on the fins of the first and second features, wherein the fins of the first and second features extend through sidewall spacers on the sacrificial gates;
selectively forming a first mask layer on the sidewall spacers and on the fin of the first features;
depositing a first dopant layer on the substrate;
heat-treating the substrate to diffuse dopants from the first dopant layer into the fin of the second feature to form a doped fin of the second feature;
removing the first mask layer from the substrate;
selectively forming a second mask layer on the sidewall spacers and on the doped fin of the second feature;
depositing a second dopant layer on the substrate;
heat-treating the substrate to diffuse dopants from the second dopant layer into the fin of the first feature to form a doped fin of the first feature; and
removing the second mask layer from the substrate.

13. The method of claim 12, further comprising removing the sacrificial gates.

14. The method of claim 13, further comprising
depositing a dielectric film on the fins of the first and second features between the sidewall spacers; and
depositing a gate electrode layer on the dielectric film.

15. The method of claim 12, further comprising
epitaxially growing source and drain structures on the doped fins of the first and second features in source and drain regions.

16. The method of claim 15, wherein the source and drain structures contain Ge or SiGe in a PFET region and SiC in a NFET region.

17. The method of claim 12, wherein the fin of the first feature includes SiGe and the fin of the second feature includes Si.

18. The method of claim 12, wherein the first dopant layer includes an n-type dopant and the second dopant layer includes a p-type dopant.

19. The method of claim 12, wherein the doped fin of the second feature includes a NFET region and the doped fin of the first feature includes a PFET region.

20. The method of claim 12, further comprising removing the first and second dopant layers from the substrate.

* * * * *